United States Patent
Liu et al.

(10) Patent No.: US 10,141,532 B2
(45) Date of Patent: *Nov. 27, 2018

(54) CURABLE ENCAPSULANTS AND USE THEREOF

(71) Applicants: HENKEL IP & HOLDING GMBH, Duesseldorf (DE); HENKEL AG & CO. KGAA, Duesseldorf (DE)

(72) Inventors: Yuxia Liu, Dayton, NJ (US); Mark Konarski, Old Saybrook, CT (US); Charles W. Paul, Morristown, NJ (US); Peter D. Palasz, Berks (GB)

(73) Assignees: HENKEL IP & HOLDING GMBH, Duesseldorf (DE); HENKEL AG & CO. KGAA, Duesseldorf (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/590,119

(22) Filed: May 9, 2017

(65) Prior Publication Data

US 2017/0244058 A1 Aug. 24, 2017

Related U.S. Application Data

(63) Continuation of application No. 14/529,438, filed on Oct. 31, 2014, now Pat. No. 9,676,928, which is a
(Continued)

(51) Int. Cl.
*H01L 51/00* (2006.01)
*H01L 51/44* (2006.01)
(Continued)

(52) U.S. Cl.
CPC ............ *H01L 51/448* (2013.01); *C08L 23/20* (2013.01); *C08L 23/22* (2013.01); *H01B 3/441* (2013.01);
(Continued)

(58) Field of Classification Search
CPC .... C08L 23/20; C08L 23/22; C08L 2203/206; C08L 2205/03; C08L 2205/025;
(Continued)

(56) References Cited

U.S. PATENT DOCUMENTS 3,234,062 A 2/1966 Morris
3,311,517 A 3/1967 Keslar et al.
(Continued)

FOREIGN PATENT DOCUMENTS

CN 102333830 A 1/2012
CN 102428138 A 4/2012
(Continued)

OTHER PUBLICATIONS

Liao, T.P. et al. "New Telechelic Polymers and Sequential Copolymers by Polyfunctional Initiator-Transfer Agents (Inifers)," Polymer Bulletin, Springer-Verlag, vol. 6, No. 3-4, 1981, pp. 135-141.
(Continued)

*Primary Examiner* — Michael L Leonard
(74) *Attorney, Agent, or Firm* — Sun Hee Lehmann

(57) ABSTRACT

The present invention relates to curable barrier encapsulants or sealants for electronic devices that have pressure sensitive adhesive properties. The encapsulants are especially suitable for organic electronic devices that require lower laminating temperature profiles. The encapsulant protects active organic/polymeric components within an organic electronic device from environmental elements, such as moisture and oxygen.

19 Claims, 1 Drawing Sheet

Related U.S. Application Data continuation of application No. PCT/US2013/034893, filed on Apr. 2, 2013.

(60) Provisional application No. 61/641,491, filed on May 2, 2012.

(51) Int. Cl.
| | |
|---|---|
| H01L 51/52 | (2006.01) |
| H01B 3/44 | (2006.01) |
| C08L 23/20 | (2006.01) |
| H01L 51/56 | (2006.01) |
| C08L 23/22 | (2006.01) |

(52) U.S. Cl.
CPC .......... H01B 3/447 (2013.01); H01L 51/5246 (2013.01); H01L 51/5259 (2013.01); H01L 51/56 (2013.01); *C08L 2203/206* (2013.01); *C08L 2205/025* (2013.01); *C08L 2205/03* (2013.01)

(58) Field of Classification Search
CPC ............. H01L 151/56; H01L 151/5259; H01L 151/448; H01L 151/5246; H01B 3/441; H01B 3/447

See application file for complete search history.

(56) References Cited

U.S. PATENT DOCUMENTS

| | | | |
|---|---|---|---|
| 3,852,136 A | 12/1974 | Plumat et al. | |
| 4,035,549 A | 7/1977 | Kennar | |
| 4,341,576 A | 7/1982 | Lewis | |
| 4,385,951 A | 5/1983 | Pressau | |
| 4,398,979 A | 8/1983 | Cathers et al. | |
| 5,171,760 A | 12/1992 | Kaszas et al. | |
| 5,415,909 A | 5/1995 | Shohi et al. | |
| 5,536,347 A | 7/1996 | Moran | |
| 5,665,823 A | 9/1997 | Saxena et al. | |
| 5,853,516 A | 12/1998 | Lehto | |
| 6,054,549 A | 4/2000 | Bahadur et al. | |
| 6,221,383 B1 | 4/2001 | Miranda et al. | |
| 6,342,116 B1 | 1/2002 | Balduin et al. | |
| 6,521,825 B2 | 2/2003 | Miura et al. | |
| 6,664,318 B1 | 12/2003 | Bymark et al. | |
| 6,706,779 B2 | 3/2004 | Bahadur et al. | |
| 6,818,819 B2 | 11/2004 | Morizane et al. | |
| 8,372,909 B2 | 2/2013 | Becker et al. | |
| 2003/0124296 A1 | 7/2003 | Smith | |
| 2004/0182493 A1 | 9/2004 | Chick | |
| 2008/0078445 A1* | 4/2008 | Patel | B32B 17/10018 136/256 |
| 2009/0162715 A1 | 6/2009 | Burdzy | |
| 2010/0120931 A1 | 5/2010 | Zajackowski et al. | |
| 2011/0105637 A1 | 5/2011 | Fujita et al. | |
| 2012/0208013 A1 | 8/2012 | Clapper et al. | |
| 2012/0216953 A1 | 8/2012 | Bharti et al. | |
| 2012/0328805 A1* | 12/2012 | Davis | B32B 7/12 428/35.2 |
| 2013/0183437 A1 | 7/2013 | Bhakta et al. | |

FOREIGN PATENT DOCUMENTS

| | | |
|---|---|---|
| EP | 1182710 A1 | 2/2002 |
| EP | 1235683 B1 | 8/2003 |
| EP | 2439246 A1 | 4/2012 |
| JP | H01-502949 A | 10/1989 |
| JP | 2000-100259 A | 4/2000 |
| JP | 2006036947 A | 2/2006 |
| JP | 2012057065 A | 3/2012 |
| KR | 1020100014781 A | 2/2010 |
| WO | 9101880 A1 | 2/1991 |
| WO | 03057478 A1 | 7/2003 |
| WO | 2007111607 A1 | 10/2007 |
| WO | 2009148722 A2 | 12/2009 |
| WO | 2011062851 A1 | 5/2011 |
| WO | 2011062932 A2 | 5/2011 |
| WO | 2012149091 A2 | 11/2012 |

OTHER PUBLICATIONS

Fouassier, Jean-Pierre, "Photoinitiation, Photopolymerization and Photocuring: Fundamentals and Applications," Hanser Publishers, 1995.

Gaudiana, Russell. "Organic Photovoltaics: Challenges and Opportunities," J. of Polymer Science: Part B: Polymer Physics 2012, 50, pp. 1014-1017, DOI: 10.1002/polb. 23083.

Dean, J. Lange's Handbook of Chemistry, 1999, McGraw Hill, Inc., New York, NY, p. 11.5. Retrieved from http://www.google.com/url?sa=t&rct=j&q=&esrc=s&frm=1&source=web&cd=1&ved=0CB8QFjAA&url=http%3A%2F%2Ffptl.ru%2Fbiblioteka%2Fspravo4niki%2Fdean.pdf&ei=DrtpVefAPMinNoDRg4AJ&usg=AFQjCNGjSLKykqtCLTFRu4kbOxlS9FMpEg&bvm=bv.94455598,d.eXY.

* cited by examiner

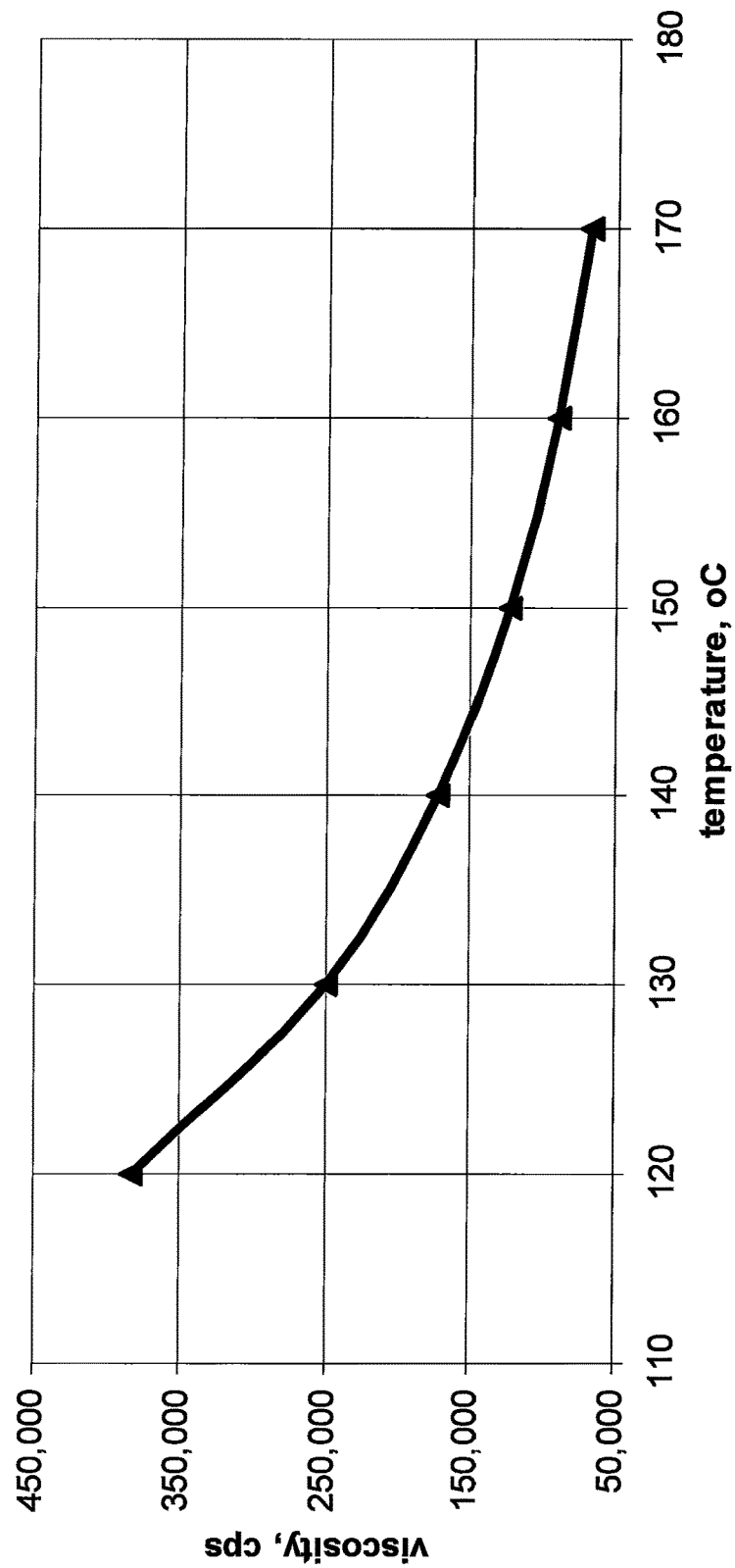

CURABLE ENCAPSULANTS AND USE THEREOF

FIELD OF THE INVENTION

The present invention relates to curable barrier encapsulant or sealant for electronic devices that have pressure sensitive adhesive properties. It is especially suitable for organic electronic device encapsulation. The encapsulant protects active organic or polymeric (hereinafter interchangeably used) components within an organic electronic device from environmental elements, such as moisture and oxygen.

BACKGROUND OF THE INVENTION

Organic electronic devices and circuits, such as, organic photovoltaics (OPV), organic light emitting diodes (OLED), organic electrophoretic displays, organic electrochromic displays, and the like, are becoming increasingly prevalent in social and commercial uses. OLED, for example, have utility in virtual-view and direct-view displays, as lap-top computers, televisions, digital watches, telephones, pagers, cellular telephones, calculators, large-area devices.

Various package geometries are known for organic electronic devices and circuits, and in general, these geometries consist of an active organic component disposed between a substrate/backsheet (hereinafter interchangeably used) and a cover/frontsheet (hereinafter interchangeably used), and the substrate and cover are adhered together with a laminating adhesive or an encapsulant that encloses the active organic component. One or both of the substrate and the cover are made of a transparent material, for example, transparent glass and flexible thin plastic films. The active organic component is attached to the substrate, and in some embodiments, is covered with an inorganic barrier coating, a buffer film or a coating composed of an inorganic and/or organic layer that seals the contact area between the component and the substrate at its perimeter. An encapsulant is applied over the active organic component, and over the barrier coating, when present. This encapsulant fills the space between the substrate and the cover, encloses the active organic component and adheres the substrate to the cover. In some embodiments, a desiccant package, in the form of a pouch, or a thin or thick film, is attached to the cover, usually in an indentation or cavity in the cover, or alternatively, the desiccant is provided in grooves within the cover.

Most active organic components within organic electronic devices are susceptible to degradation by moisture and oxygen. For example, an OLED, simply described, consists of an anode, a light emitting layer, and a cathode. A layer of a low work function metal is typically utilized as the cathode to ensure efficient electron injection and low operating voltages. Low work function metals are chemically reactive with oxygen and moisture, and such reactions will limit the lifetime of the devices. Oxygen and moisture will also react with the light emitting organic materials and inhibit light emission. Therefore, the packages surrounding the active organic components are designed to restrict transmission of both oxygen and water vapor from the environment to the active organic components.

An encapsulant with pressure sensitive adhesive properties can be used to restrict transmission of oxygen and water vapors, and the pressure sensitive adhesive is typically provided in a thin film between two silicone release carrier films (liners) as an encapsulant film. Upon removal of one of the liners, the exposed encapsulant film is attached to either the cover or the substrate of the device. Subsequently, the second liner is removed, allowing the cover and the substrate to be laminated (or attached) to one another. The encapsulant film must maintain adhesion and flexibility upon long term exposure to strain.

An encapsulant film or encapsulant (hereinafter interchangeably used) with pressure sensitive adhesive properties can facilitate manufacturing through-put of the device. While manufacturing speed and toxicity are improved for encapsulant with pressure sensitive adhesive properties, drawbacks include poor wet out and void formation during assembly because films typically have higher viscosity than their liquid encapsulant counterparts at assembly temperatures. This problem is exacerbated for substrate that contains components such as, electrodes, bus bars, ink steps, integrated circuits, wires, and the like, due to their irregular surfaces. In order to obtain better wet out and to minimize the formation of voids, hot lamination is usually applied to the uncured encapsulant film. However, organic components are sensitive to heat and prolonged exposure to heat is detrimental to the components. Also, because the encapsulants are pressure sensitive adhesive film, the film must maintain minimal cold flow at room temperature during prolonged storage.

WO 2009/148722 and WO 2011/062932 disclose the use of high (typically greater than 300,000 Da) weight average molecular weight (Mw) polyisobutylene-based encapsulants. Such encapsulants yield pressure sensitive adhesive films having high viscosity, and thus are susceptible to voids or air bubbles in organic electronic devices. While application temperature can be increased to minimize this problem, active organic components start to decompose at about 120° C. Moreover, encapsulants made from such high Mw are formed by solution casting, and are not extruded as hot melts, unless extreme temperatures and pressure can be utilized.

JP2012057065 discloses non-curable encapsulants with pressure sensitive adhesive properties. In order to properly wet the substrates with components and to minimize void formations, the viscosity of the encapsulant film must be kept below 1,000,000 cps or below 200,000 Da viscosity average molecular weight (Mv) at 120° C. Furthermore, the thermal plastic encapsulant exhibits cold flow under strain during the lifetime of the device.

Therefore, there is a need in the art for a curable encapsulant film that can laminate at temperatures below 120° C., maintain good adhesion, wet-out on the substrates with irregular surface, minimize cold flow, and form a void-free encapsulation while allowing for flexibility of the substrates over long term exposure to strain. The current invention fulfills this need.

BRIEF SUMMARY OF THE INVENTION

The invention provides radiation or heat curable encapsulants suitable for sealing and adhering substrates and covers of organic electronic devices to protect the active organic components of the device from moisture and oxygen. The radiation or heat curable encapsulants have pressure sensitive properties which allow the devices to maintain flexibility and creep resistance upon long term exposure to strain. The encapsulants comprise a barrier rubber, a radiation or heat reactive barrier resin, and a radical initiator. The encapsulants may further comprise a diluent, wax, antioxidant, and/or desiccant fillers.

In one embodiment, the curable encapsulant comprises:
(a) a polyisobutylene (PIB) having a Mw of from about 1,000 to about 95,000 Da;
(b) a functionalized polyisobutylene having (i) a Mw (weight average molecular weight) of from about 1,000 to about 95,000 Da and (ii) greater than one free-radical reactive functional group, wherein the free-radical reactive functional group is selected from the group consisting of terminal (meth)acrylates, pendant (meth)acrylates, terminal acrylates, and/or pendant acrylates; and
(c) a radical initiator.

The encapsulant is essentially free of any acrylic monomer with Mw less than about 1,000 Da or volatile organic compound with Mw less than about 1,000 Da, and the encapsulant is essentially free of a tackifier. The term "essentially free of," herein, indicates that the encapsulant contains less than 5,000 ppm (parts-per-million) based on the entire encapsulant composition. The curable encapsulant may further comprise of a functionalized polyolefin having (i) a Mw of from about 1,000 to about 95,000 Da and (ii) the functionalized polyisobutylene contains greater than 1 free-radical reactive functional group, wherein the free-radical reactive functional group is selected from the group consisting of terminal (meth)acrylates, pendant (meth)acrylates, terminal acrylates, and/or pendant acrylates.

In another embodiment, the curable encapsulant comprises:
(a) a polyisobutylene having a Mw of from about 1,000 to about 95,000 Da;
(b) a functionalized polyolefin having (i) a Mw of from about 1,000 to about 95,000 Da and (ii) greater than 1 free-radical reactive functional group, wherein the free-radical reactive functional group is selected from the group consisting of terminal (meth)acrylates, pendant (meth)acrylates, terminal acrylates, and/or pendant acrylates; and
(c) a radical initiator.

The encapsulant is essentially free of any acrylic monomer with Mw less than about 1,000 Da or volatile organic compound with Mw less than about 1,000 Da, and the encapsulant is essentially free of a tackifier.

In a further embodiment, the curable encapsulant comprises:
(a) an amorphous polyalphaolefin having a Brookfield viscosity less than 8,000 cps at 190° C.
(b) a functionalized polyolefin having (i) a Mw of from about 1,000 to about 95,000 Da and (ii) the functionalized polyisobutylene contains greater than 1 free-radical reactive functional group, wherein the free-radical reactive functional group is selected from the group consisting of terminal (meth)acrylates, pendant (meth)acrylates, terminal acrylates, and/or pendant acrylates; and
(c) a radical initiator; and
(d) a tackifier.

The encapsulant is essentially free of an acrylic monomer with Mw less than about 1,000 Da or volatile organic compound with Mw less than about 1,000 Da.

For the above curable encapsulants, the radical initiator is selected from the group consisting of photoinitiators and thermal initiators. Curable encapsulants with photoinitiators are typically formed as hot melts, and the Brookfield viscosity of the encapsulant ranges from about 10,000 to about 900,000 cps at 130° C. Curable encapsulants with thermal initiators are typically solution cast, and the Brookfield viscosity of the encapsulant ranges from about 10,000 to about 900,000 cps at 80° C.

In another embodiment, the curable encapsulant is formed by combining the above described components of the encapsulants at 80° C. to about 150° C. until a homogeneous melt is formed, extruding or casting the melt to a thickness of about 0.01 to about 10 mm film, and cooling the film.

Yet in another embodiment, the curable encapsulant is formed by combining the above described components of the encapsulants with a solvent at room temperature until a homogeneous mixture is formed, casting the mixture to a thickness of about 0.01 to about 10 mm film, and evaporating or driving off the solvent.

Another embodiment is directed to a process for forming a cured encapsulant device comprising the steps of:
(1) applying above described curable encapsulants onto at least a portion of a substrate at a temperature of from about 50 to about 120° C.;
(2) applying a cover onto the curable encapsulant; and
(3) curing the curable encapsulant
whereby the encapsulant cures and adheres the substrate to the cover. Curing the curable encapsulant is conducted by UV irradiation and/or thermal radiation. In another embodiment, the curable encapsulant is first applied onto the cover in step (1), and the substrate is applied onto the curable encapsulant at step (3).

Yet another embodiment is directed to devices comprising the above described cured encapsulant. Devices include electronic, optoelectronic, OLED, photovoltaic cells, organic photovoltaic cells, flexible thin film organic photovoltaic cells, CIGS photovoltaic cells, and the like.

BRIEF DESCRIPTION OF THE DRAWINGS

FIG. 1 is a Brookfield viscosity curve.

DETAILED DESCRIPTION OF THE INVENTION

All references cited herein are incorporated in their entirety by reference.

The term radiation cure herein refers to toughening, hardening or vulcanization of the curable portion of the encapsulant through actinic radiation exposure. Actinic radiation is electromagnetic radiation that induces a chemical change in a material, and for purposes within this specification and claims will include electron-beam curing. In most cases, such radiation is ultraviolet (UV) or visible light. The initiation of this cure is achieved through the addition of an appropriate photoinitiator. The cure of the encapsulant is achieved by direct exposure to ultraviolet (UV) or visible light or by indirect exposure through transparent lid or cover sheet that are made of polyester, polycarbonate, glass, and the like.

The term heat cure refers to toughening, hardening or vulcanization of the curable portion of the encapsulant through exposure to heat in oven, infrared (IR), near IR, or microwave. The heat cure temperature is between 50-200° C., preferably 100-170° C.

Polyisobutylenes (PIB) and PIB diluents are substantially homopolymers of isobutylene. They can also be called polybutene and butyl rubbers. They usually contain less than 75% terminal alpha olefins per polymer chain. The PIB and PIB diluents are free of any other radical reactive functional groups including, but are not limited to, acrylate, (meth)acrylate, styrenic C=C bonds, diallyl, maleic anhydride, and the like. Commercially available PIB and PIB diluents include, but not limit to, Oppanol, Glissopal, and Indopol. While many of these PIB may contain even up to 75% terminal alpha C═C bonds, the reactivity of these PIB towards free radical reaction are relatively low and incomplete, and are therefore considered to be non-reactive or non-curable PIB. Moreover, the weight average molecular weight (Mw) of the PIB and PIB diluents ranges from about 1,000 to about 95,000 Da. PIB diluents typically have a Mw ranging from about 1,000 to about 10,000 Da. These low Mw and low viscosity PIB polymers are preferred in the encapsulant to achieve 100% wet out and coatable hot melts.

PIB in the curable encapsulant is in the amount ranging from about 10 to about 90 weight percent, more preferably from about 70-90 weight percent, based on the total weight of the curable encapsulant, without accounting for any solvents.

Exemplary amorphous polyalphaolefin (APAO) include polymers of random copolymers or terpolymers of ethylene, propylene, and butene, and other substantially amorphous or semicrystalline polymers. Suitably, the APAO includes between about 20% and about 80% copolymers or terpolymers and between about 20% and about 80% other substantially amorphous or semi-crystalline propylene-ethylene polymers. Alternatively the APAO includes between about 40% and about 60% copolymers or terpolymers and between about 40% and about 60% other substantially amorphous or semi-crystalline propylene-ethylene polymers. APAO may be a 1-butene copolymer with ethylene or propylene, or a 1-butene terpolymer with ethylene and propylene, having a Brookfiled viscosity less than 8,000 cps at 190° C. The 1-butene copolymer should include about 20% to about 65% by weight 1-butene, or about 30% to about 55% by weight 1-butene. Alternatively, the APAO may include an ethylene-propylene copolymer having up to 80% ethylene. Commercially suitable APAO includes Rextac (Rexene LLC), Eastoflex (Eastman Corporation), Vestoplast (Evonik Corporation). Suitable APAO has a viscosity less than 8,000 cps at 190° C. Metallocene catalyzed semicrystalline polyolefin with melting point less than about 100° C. can also be suitable in the curable encapsulant and replace APAO which uses Ziegler Natta catalyst. Exemplary low melting point semicrystalline polyolefins includes C2-C6 polyolefins, which have weight average molecular weight less than about 100,000 Da and polydispersity index less than about 3. These low melting point semicrystalline polyolefins are commercially available from Exxon Mobil as Linxar series.

APAO in the curable encapsulant is in the amount ranging from about 10 to about 90 weight percent, more preferably from about 70-90 weight percent, based on the total weight of the curable encapsulant, without accounting for any solvent.

Exemplary functionalized PIB includes, but are not limited to, diallyl polyisobutylene, di(meth)acrylate polyisobutylene, and vinyl-terminal polyisobutylene. Representative polyisobutylene (meth)acrylate are described in U.S. Pat. No. 5,171,760 issued to Edison Polymer Innovation Corp., U.S. Pat. No. 5,665,823 issued to Dow Corning Corp., and Polymer Bulletin, Vol. 6, pp. 135-141 (1981), T. P. Liao and J. P. Kennedy. Representative polyisobutylene vinyl ethers are described in Polymer Bulletin, Vol. 25, pp. 633 (1991), J. P. Kennedy, and in U.S. Pat. Nos. 6,054,549, 6,706,779B2 issued to Dow Corning Corp. Preferred functionalized PIB is a free radical reactive polyisobutylene, butyl rubber derivatives, and like, which are terminated or grafted with (meth)acrylic or 75% of alpha-olefin functional groups. Particularly, the functionalized polyisobutylene has (i) a Mw of from about 1,000 to about 95,000 Da and (ii) contains greater than one free-radical reactive functional group per polymer chain. The functionalized PIB is formed with free-radical functional group selected from terminal (meth)acrylates, pendant (meth)acrylates, terminal acrylates, and/or pendant acrylates.

Functionalized polyolefin in the invention includes free radical reactive (meth)acrylic terminal and grafted pendant functional oligomers, polymers, or random copolymers of butadiene, isoprene, ethylene, propylene, butene and derivatives. The functionalized polyolefin has a Mw from about 1,000 to about 95,000 Da and contains greater than one free-radical reactive functional group in the polymer chain. The functionalized polyolefin is formed with free-radical functional group is selected from terminal (meth)acrylates, pendant (meth)acrylates, terminal acrylates, and/or pendant acrylates. The functionalized olefin is formed with free-radical functional group is selected from terminal (meth)acrylates, pendant (meth)acrylates, terminal acrylates, and/or pendant acrylates. Exemplary functionalized oligomers, polymers or copolymers include, but are not limited to, di(meth)acrylated-polybutadienes, di(meth)acrylated-polyisoprenes, hydrogenated di(meth)acrylated-polybutadienes, hydrogenated di(meth)acrylated-polyisoprenes, many of which are available from Sartomer and Kuraray. "(Meth)acrylated" is defined herein as being functionalized with either acrylate or methacrylate. In other embodiments, other reactive liquid oligomers and/or polymers that are (meth)acrylated and can be partially used to replace the curable functional polyolefin, and they include, but are not limited to, (meth)acrylated-polyurethanes, (meth)acrylated urethane oligomers, and (meth)acrylated-polyesters, (meth)acrylated styrene-butadiene copolymer, (meth)acrylated acrylonitrile-butadiene copolymer, (meth)acrylated polysiloxanes, (meth)acrylated EPDM rubber (ethylene propylene diene copolymer), (meth)acrylated butyl rubber, (meth)acrylated bromobutyl rubber (bromoisobutylene-isoprene copolymer), (meth)acrylated chlorobutyl rubber (chloroisobutylene-isoprene copolymer. These resins are commercially available without the (meth)acrylate functionality and can be functionalized without undue experimentation by those skilled in the art.

Functionalized PIB in the curable encapsulant is in the amount ranging from about 5 to about 90 weight percent, more preferably from about 10-50 weight percent, based on the total weight of the curable encapsulant, without accounting for any solvent.

Examples of terminal and/or grafted pendant functionalities that are reactive and curable by radiation or heat in the reactive PIB or the reactive polyolefin include, but are not limited to, those selected from the groups consisting of acrylate, methacrylate, vinyl, vinyl ether, propenyl, crotyl, allyl, silicon-hydride, vinylsilyl, propargyl, cycloalkenyl, thiol, glycidyl, aliphatic epoxy, cycloaliphatic epoxy, oxetane, itaconate, maleimide, maleate, fumarate, cinnamate esters, styrenic, acrylamide, methacrylamide, and chalcone groups.

The radical cure initiator includes a radical polymerization initiator that generates radicals by being decomposed by electromagnetic energy rays such as UV rays, or a thermally decomposable radical initiator that generates radicals by being thermally decomposed. Radical photopolymerization initiating system comprising one or more photoinitiators can be found in Fouassier, J-P., Photoinitiation, Photopolymerization and Photocuring Fundamentals and Applications 1995, Hanser/Gardner Publications, Inc., New York, N.Y.

The radical photopolymerization initiators include Type I alpha cleavage initiators such as acetophenone derivatives such as 2-hydroxy-2-methylpropiophenone and 1-hydroxycyclohexyl phenyl ketone; acylphosphine oxide derivatives such as bis(2,4,6-trimethylbenzoyl) phenylphosphine oxide; and benzoin ether derivatives such as benzoin methyl ether and benzoin ethyl ether. Commercially available radical photoinitiators include Irgacure 651, Irgacure 184, Irgacure 907, Darocur 1173 and Irgacure 819 from Ciba Speciality Chemical. Type II photointiators are also suitable for the curable encapsulant, and they include benzophenone, isopropylthioxanthone, and anthroquinone. Many substituted derivatives of the aforementioned compounds may also be used. The selection of a photoinitiator for the radiation curable encapsulant is familiar to those skilled in the art of radiation curing. The photoinitiator system will comprise one or more photoinitiators and optionally one or more photosensitizers. The selection of an appropriate photoinitiator is highly dependent on the specific application in which the encapsulant is to be used. A suitable photoinitiator is one that exhibits a light absorption spectrum that is distinct from that of the resins, and other additives in the encapsulant. The amount of the photoinitiator is typically is in a range of about 0.01 to about 10 wt %, preferably, from about 0.01 to about 5 wt %, based on the total weight of the encapsulant, without accounting for solvent.

In one embodiment, the encapsulant is cured through an optical clear cover or frontsheet, the photoinitiator must be capable of absorbing radiation at wavelengths for which the cover or substrate is transparent. For example, if an encapsulant is to be cured through a sodalime glass coverplate, the photoinitiator must have significant UV absorbance above 320 nm. UV radiation below 320 nm will be absorbed by the sodalime glass coverplate and not reach the photoinitiator. In this example, it would be beneficial to include a red shifted photoinitiator or a photosensitizer with the photoinitiator into the photoinitiating system, to augment the transfer of energy to the photoinitiator. If an encapsulant is to be cured through a barrier PET film with cut off absorbance below 400 nm, the photoinitiator must have UV absorbance above 400 nm. Examples of such photointiators include, but are not limited to, Irgacure® 819, Irgacure® 2022, Lucirin TPO or TPO-L, which are commercially available from BASF.

The thermally curable radical polymerization initiators include peroxides, such as, 1,1,3,3-tetramethylbutyl peroxy-2-ethyl-hexanoate, 1,1-bis (t-butylperoxy) cyclohexane, 1,1-bis(t-butylperoxy)cyclo-dodecane, di-t-butyl peroxy-isophthalate, t-butyl peroxybenzoate, dicumyl peroxide, t-butyl cumyl peroxide, 2,5-dimethyl-2,5-di(t-butylperoxy) hexane, 2,5-dimethyl-2,5-di(t-butylperoxy)-3-hexyne and cumene hydroperoxide. The amount of the radical thermal initiator is typically is in a range of about 0.01 to about 10 wt %, based on the total weight of the encapsulant, without accounting for solvent.

In one embodiment, the thermal-curing initiator is desirably selected to provide a moderate initiation temperature, which is high enough to prevent premature cross-linking, but also low enough to prevent exposing electronic devices to excess temperatures. Such excess temperatures may degrade the reactive organic components within the devices. Examples of suitable commercially available free radical thermal initiator include, but are not limited to, LUPEROX TBEC from United Initiators, TRIGONOX 101 and TRIGONOX 201 from Akzo Nobel Polymer Chemicals, LUPEROX 101 and LUPEROX 231 from Arkema, DICUP from GEO Specialty Chemicals, 2,5,-Dimethyl-2,5 BIS (Tert-Butyl Peroxy) Hexyne-3, such as those available under the trade designation LUPEROX 130 from Arkema, TRIGONOX 145 from Akzo Nobel Polymer Chemicals; Di-Tert-Butyl Peroxide such as those available under the trade designation TRIGONOX B from Akzo Nobel Polymer Chemicals. Suitable amounts of thermal free radical initiators range from about 0.01 to about 10 wt %, based on the total weight of the encapsulant, without accounting for solvent. Typical cure temperatures for these free radical initiators typically range from about 130 to about 200° C., but temperatures can be increased for faster cures.

In some embodiment, inorganic fillers may be used to improve the moisture and oxygen barrier properties of the encapsulant. Representative fillers include, but are not limited to, ground quartz, fused silica, amorphous silica, talc, glass beads, graphite, carbon black, alumina, clays, grapheme, nanoclay, mica, aluminum nitride, and boron nitride. Metal powders and flakes consisting of silver, copper, gold, tin, tin/lead alloys, and other alloys also are suitable fillers for conductive applications. Organic filler powders such as poly-(tetrachloro-ethylene), poly(chlorotrifluoroethylene), poly(vinylidene chloride) may also be used. The type and amount of such fillers suitable for use in radical-curable encapsulant is within the expertise of the practitioner skilled in the art. Generally, however, such fillers will be present in amounts ranging from 0.5 to 50 wt % of the total encapsulant, without accounting for solvent.

In a further embodiment, desiccant may be used to improve the moisture barrier properties of the encapsulant. When added, desiccant comprise up to 20 wt % of the encapsulant, not including the solvent. The fillers with desiccant properties (referred to as desiccant fillers) suitable for use may be any of those that provide an appropriate moisture scavenging rate, capacity, and residual moisture level (the lowest level of moisture at which the desiccant can actively scavenge water) to meet the allowable moisture level for the specific electronic device. The desiccant fillers will be capable of reacting with, absorbing, or adsorbing water and/or water vapor. A representative list of such desiccants can be found in Dean, J. Lange's Handbook of Chemistry, 1999, McGraw Hill, Inc., New York, N.Y., pp. 11.5.

In general, suitable desiccants include metal oxides, such as, CaO, BaO, MgO; other oxides, such as $SiO_2$, $P_2O_5$, $Al_2O_3$; metal hydrides, such as $CaH_2$, NaH, $LiAlH_4$; metal salts, such as $CaSO_4$, $Na_2SO_4$, $MgSO_4$, $CaCO_3$, $K_2CO_3$, and $CaCl_2$; powdered zeolites, such as 4A and 3A molecular sieves; metal perchlorates, such as, $Ba(ClO_4)_2$, $Mg(ClO_4)_2$; superabsorbant polymers, such as, lightly cross linked poly (acrylic acid); and metals that react with water, such as calcium. As with any filler, the desiccant filler particle size, particle size distribution, shape, and surface functionality will affect the level to which it can be loaded into a resin system and what rheology may result. Such factors are understood by those skilled in the art and are not otherwise relevant to the current inventive compositions. Blends of the more common non-desiccant fillers disclosed above and these desiccant fillers are contemplated and described within the examples. A common range for the particle size of the desiccant filler is from about 0.001 to about 200 micrometers. The practitioner with skill in the art will be able to determine the appropriate particle size range for the resin, rheology, and scavenging rate needed for the particular end use application.

The encapsulant may further comprise plasticizers, tackifier, wax, and mineral oil to adjust the viscosity of the formulations.

A non-limiting example of a plasticizer includes polar plasticizer, solid plasticizer, liquid plasticizer (natural and synthetic), and plasticizer that is primarily aliphatic in character and is compatible with PIB and polyolefins. Solid plasticizer is a solid at ambient temperature, and preferably has a softening point above 60° C. Any solid plasticizer that is able to subsequently recrystallize in the encapsulant is suitable. Examples include 1,4-cyclohexane dimethanol dibenzoate, Benzoflex 352, available from Genovique Specialties. A non-limiting example of a natural liquid plasticizer is a vegetable oil. Synthetic liquid plasticizers include liquid polyolefins, iso-paraffins or paraffins of moderate to high molecular weight. Examples include SpectraSyn Plus 6 from ExxonMobil Chemical. Exemplary liquid tackfiers (having a Ring and Ball softening point below about 25° C.) are liquid tackifying diluents that include polyterpenes such as Wingtack 10 available from Sartomer, and Escorez 2520 available from ExxonMobil Chemical. The synthetic liquid oligomers are high viscosity oligomers of polybutene, polypropene, polyterpene, and etc., which are permanently in the form of a fluid. Examples include polyisoprene, available as LIR 50 from Kuraray, and Amoco's polybutenes available under the name Indopol, Wingtack 10 from Sartomer and synthetic liquid oligomer polybutenes such as Indopol 300 from Amoco.

Suitable tackifiers include, but are not limited to, any resins or mixtures compatible to PIB or polyolefins thereof such as (1) natural or modified rosins such, for example, as gum rosin, wood rosin, tall oil rosin, distilled rosin, hydrogenated rosin, dimerized rosin, and polymerized rosin; (2) glycerol and pentaerythritol esters of natural or modified rosins, such, for example as the glycerol ester of pale, wood rosin, the glycerol ester of hydrogenated rosin, the glycerol ester of polymerized rosin, the pentaerythritol ester of hydrogenated rosin, and the phenolic-modified pentaerythritol ester of rosin; (3) copolymers and terpolymers of natural terpenes, e.g., styrene/terpene and D-methyl styrene/terpene; (4) polyterpene resins having a softening point, as determined by ASTM method E28,58T, of from about 80 to about 150° C.; the latter polyterpene resins generally resulting from the polymerization of terpene hydrocarbons, such as the bicyclic monoterpene known as pinene, in the presence of Friedel-Crafts catalysts at moderately low temperatures; also included are the hydrogenated polyterpene resins; (5) phenolic modified terpene resins and hydrogenated derivatives thereof, for example, as the resin product resulting from the condensation, in an acidic medium, of a bicyclic terpene and phenol; (6) aliphatic petroleum hydrocarbon resins having a Ball and Ring softening point of from about 70 to about 135° C.; the latter resins resulting from the polymerization of monomers consisting of primarily of olefins and diolefins; also included are the hydrogenated aliphatic petroleum hydrocarbon resins; (7) alicyclic petroleum hydrocarbon resins and the hydrogenated derivatives thereof; and (8) aliphatic/aromatic or cycloaliphatic/aromatic copolymers and their hydrogenated derivatives. The desirability and selection of the particular tackifiers can depend upon the compatibility with other components in the barrier film formulations. When present, the encapsulant compositions of the invention will typically comprise the tackifier in amounts of less than about 80 wt %, typically from about 10 to about 65 wt % based on the total weight of the encapsulant, not accounting for any solvent.

Suitable waxes compatible to PIB or polyolefins include petroleum based, conventional wax, natural-based wax, functionalized wax, and polyolefin copolymers. The term petroleum derived wax includes both paraffin and microcrystalline waxes having melting points within the range of from about 130° F. to about 225° F. as well as synthetic waxes such as low molecular weight polyethylene or Fisher-Tropsch waxes. Most preferred are polyethylene or Fisher-Tropsch waxes with a melting point of at least about 175° F. Amounts of wax necessary to achieve the desired properties will typically range from about 0.5 to about 10 wt % of a wax, based on the total weight of the encapsulant, not accounting for solvent.

A non-limiting example of oils include paraffinic and naphthenic petroleum oil, highly refined technical grade white petroleum mineral oils such as Kaydol oil from Crompton-Witco and naphthenic petroleum oil such as Calsol 5550 from Calumet Lubricants. Diluent can also be a liquid tackifier (having a Ring and Ball softening point below about 25° C.), synthetic liquid oligomer, and mixtures thereof. When present, the formulations of the invention will typically comprise the oil diluent in amounts of less than about 50 wt % based on the total weight of the encapsulant, not accounting for solvent.

The curable encapsulant may optionally comprise additives including thermal stabilizers, antioxidants, UV absorbers, and hindered amine light stabilizers. Any known thermal stabilizer may be suitable, and preferred general classes of thermal stabilizers include, but are not limited to, phenolic antioxidants, alkylated monophenols, alkylthiomethylphenols, hydroquinones, alkylated hydroquinones, tocopherols, hydroxylated thiodiphenyl ethers, alkylidenebisphenols, O-, N- and S-benzyl compounds, hydroxybenzylated malonates, aromatic hydroxybenzyl compounds, triazine compounds, aminic antioxidants, aryl amines, diaryl amines, polyaryl amines, acylaminophenols, oxamides, metal deactivators, phosphites, phosphonites, benzylphosphonates, ascorbic acid (vitamin C), hydroxylamines, nitrones, thiosynergists, benzofuranones, indolinones, and the like, and mixtures thereof. Use of a thermal stabilizer is optional and in some instances is not preferred, especially if it reacts and degrades the active organic component within the electronic device. When thermal stabilizers are used, they may be present at a level of about 0.00005 wt % and up to about 10 wt % based on the total weight of the encapsulant, not accounting for solvent.

Any known UV absorber may be suitable for use in the encapsulant composition, and preferred general classes of UV absorbers include, but are not limited to, benzotriazole derivatives, hydroxybenzophenones, hydroxyphenyl triazines, esters of substituted and unsubstituted benzoic acids, and the like and mixtures thereof. Hindered amine light stabilizers (HALS) can be used and are also well known in the art. Generally, hindered amine light stabilizers are secondary, tertiary, acetylated, N-hydrocarbyloxy substituted, hydroxyl-substituted N-hydrocarbyloxy substituted, or other substituted cyclic amines which are characterized by a substantial amount of steric hindrance, generally derived from aliphatic substitution on the carbon atoms adjacent to the amine function. Use of a UV absorber is optional and in some instances is not preferred, especially if it reacts and degrades active organic component within the electronic device. When UV absorbers are utilized, they may be present in the formulation at a level of about 0.00005 wt % and up to about 10 wt % based on the total weight of the curable encapsulant, not accounting for solvent.

Examples of silane coupling agents that are useful in the encapsulant composition include, but are not limited to, C3-C24 alkyl trialkoxysilane, (meth)acryloxypropyltrialkoxysilane, chloropropylmethoxysilane, vinylthmethoxysilane, vinylthethoxysilane, vinyltrismethoxyethoxysilane, vinylbenzylpropylthmethoxysilane, aminopropyltrimethoxysilane, vinylthacetoxysilane, glycidoxypropyltrialkoxysilane, beta.-(3,4-epoxycyclohexyl)ethyltrimethoxysilane, mercaptopropylmethoxysilane, aminopropyltrialkoxysilane, and mixtures of two or more thereof. Use of a silane coupling agents is optional and in some instances is not preferred, especially if it reacts and degrades active organic component within the electronic device. When silane coupling agents are utilized, they may be present in the formulation at a level of about 0.01 wt % and up to about 10 wt % based on the total weight of the curable encapsulant, not accounting for solvent.

Other additives conventionally used in pressure sensitive adhesives to satisfy different properties and meet specific application requirements also may be added to the curable encapsulant. Such additives include, but are not limited to, pigments, flow modifiers, dyestuffs, which may be incorporated in minor or larger amounts into the encapsulant composition, depending on the purpose.

The curable encapsulant films can be delivered as sheets or in rolls on substrates such as PET, glass, etc.; or between carrier films, such as silicone PET or Kraft paper release liners. The sheets or rolls comprising the encapsulant films may be produced by any suitable process. For example, the sheets may be formed by solution casting or dip coating. Solution casting is prepared using techniques known in the art. Typically, the encapsulant components are all dissolved in a solvent or a mixture of solvents e.g., xylene, toluene, heptane, hexane, cyclohexane, and the like, to form a solution. The solution is cast as a film with a specified weight per square meter, and the solvent is then let evaporate to form the solid encapsulant film. Preferred processes are hot melt film extruding, compression molding, injection molding, lamination, blown film processes, tandem extrusion coating, hot melt extrusion casting, melt coextrusion casting, or any suitable melt processes known to those of skill in the art. The hot melts are prepared using techniques known in the art. Typically, the hot melt is prepared by blending the components in the melt at a temperature of about 50-190° C. until a homogeneous blend is obtained, generally about two hours. The blending temperature should be kept as low as possible to avoid premature cross-linking and is depended on specific formulations and components, especially if the encapsulant compositions are heat curable. Various methods of blending are known in the art and any method that produces a homogeneous blend is satisfactory. During the hot melt film coating process, the temperature of the hot melt should be maintained below 150° C. to avoid premature cross-linking or decomposition. In some film extrusion processes, the temperature of the hot melt is held at or below about 120° C., 110° C. or even below 100° C.

The curable encapsulants are coated in between two liners to form curable encapsulant free films that have pressure sensitive adhesive properties. The curable encapsulant have a Brookfield viscosity range of from about 10,000 to about 900,000 cps at the coating temperature, typically in the ranges of about 50 to about 200° C., preferably 10,000 to 500,000 cps from about 100 to about 130° C. Such viscosity ranges allow the encapsulant to be hot melt coat-able into films. The film thickness ranges from about 0.01 mm to about 10 mm, preferably from about 0.03 to about 0.5 mm. The curable encapsulant films remain as pressure sensitive adhesive films at or below 35° C. and with minimal cold flow in storage.

Upon removal of the first liner, the exposed curable encapsulant film is laminated to either the frontsheet or the substrate with pressure. Subsequently, the second liner is removed and the encpasulant film is laminated to the remaining frontsheet or the substrate. In one embodiment, the curable encapsulant film is laminated to both front sheet and substrate simultaneously. Heat (ranging from about 50° C. to about 190° C., preferably from about 80° C. to about 150° C., and/or vacuum can be applied to encourage lamination, and to remove any entrapped air and to eliminate any voids in between the layers. In another embodiment, because organic active components on the substrate start to decompose at temperatures above 120° C., preferred laminating temperature ranges below about 120° C., and in some application below about 110° C. The curable encapsulant film is then cured by heat or UV irradiation. Heat cure can be completed with temperatures of from about 100 to about 190° C. UV cure is completed with UV irradiation ranging from about 280 to about 450 nm.

The cured encapsulant film maintains flexibility and resists creep upon long term exposure to strain. The creep or cold flow can manifest as delamination failure of the flexible display or thin film photovoltaic when it is bent or held vertical in rigid displays or photovoltaic for long periods.

In one embodiment, the encapsulant film has irregular surfaces on both sides of the substrate and cover to facilitate deaeration during the lamination process. Irregular surfaces can be created by mechanically embossing or by melt fracture during extrusion of the sheets followed by quenching so that surface roughness is retained during handling. The surface pattern can be applied to the sheet through well-known, common art processes. For example, the extruded sheet may be passed over a specially prepared surface of a die roll positioned in close proximity to the exit of the extruder die. This imparts the desired surface characteristics to one side of the molten polymer exiting the die. Thus, when the surface of such a die roll has minute peaks and valleys, it will impart a rough surface to the side of the polymer sheet that passes over the roll, and the rough surface will generally conform respectively to the valleys and peaks of the roll surface. Such die rolls are described in, e.g., U.S. Pat. No. 4,035,549 and U.S. Patent Publication No. 2003/0124296.

In another embodiment, the encapsulant films may be in a single layer or in multilayer form. The term "single layer" refers to sheets that are made of or that consist essentially of adhesive described in the invention. When in a multilayer form, the sheet comprises sublayers, and at least one of the sub-layers is made of or consists essentially of the adhesive in the invention, while the other sub-layer(s) may be made of or comprise any other suitable polymeric material(s), such as, for example, copolymers of α-olefins and α,β-ethylenically unsaturated carboxylic acids (i.e., acid copolymers), partially neutralized ionic acid copolymers (i.e., ionomers), ethylene/vinyl acetate copolymers, polyvinyl acetals) (including acoustic grade polyvinyl acetals), polyurethanes, polyvinylchlorides, polyethylenes (e.g., linear low density polyethylenes), polyolefin block copolymer elastomers, copolymers of α.-olefins and α,β-ethylenically unsaturated carboxylic acid esters (e.g., ethylene methyl acrylate copolymers and ethylene butyl acrylate copolymers), silicone elastomers, epoxy resins, and combinations of two or more thereof.

Yet in another embodiment, the curable encapsulant described herein is used as encapsulant for photovoltaic cell module. In forming the photovoltaic cell, the encapsulant sheet or roll, comprising the curable encapsulant in a pressure sensitive adhesive film form, is laminated to the photovoltaic module assembly. The photovoltaic module assembly includes any article or material that can convert light into electrical energy. Useful photovoltaic cell includes, but are not limited to, wafer-based photovoltaic cells (e.g., c-Si or mc-Si based photovoltaic cells, and thin film photovoltaic cells (e.g., a-Si, c-Si, CdTe, copper indium selenide (CIS), copper-indium-gallium selenide (GIGS), light absorbing dyes, or organic semiconductor based solar cells. Within the photovoltaic module assembly, it is preferred that the cells be electrically interconnected or arranged in a flat plane. In addition, the photovoltaic module assembly may further comprise electrical wirings, such as cross ribbons and bus bars.

The photovoltaic module/cell ((herein interchangeably used) assembly may be bifacial. In such embodiments, all the laminating materials positioned on either side of the photovoltaic cell should be sufficiently transparent to allow adequate sunlight or reflected sunlight to reach the photovoltaic cells. Alternatively, the photovoltaic cell may have a front sun-facing side (which is also referred to as a front side and, when in actual use conditions, generally faces toward the sun) and a back non-sun-facing side (which is also referred to as a back side and, when in actual use conditions, generally faces away from the sun). The photovoltaic cells define the boundary between the front and back sides of the photovoltaic cell assembly. In such assembly, all the materials that are present in the laminate layers positioned in the front sun-facing side of the solar cell assembly should have sufficient transparency to allow adequate sunlight to reach the photovoltaic cells. The materials present in the laminate layers positioned in the back non-sun-facing side of the photovoltaic cell layer need not be transparent. The photovoltaic cell typically comprises at least one encapsulant layer comprising the encapsulant, which is laminated to the solar cell assembly. Two components that are "laminated" to each other are bonded either directly (i.e., without any additional material between the two layers) or indirectly (i.e., with additional material, such as interlayer or adhesive materials, between the two layers). In certain laminates, the encapsulant layer comprising the blend composition is directly bonded to the photovoltaic cell layer.

In one embodiment, the photovoltaic cell assemblies have irregular surfaces with peaks and voids. Therefore, during the lamination process, the encapsulant sheet comprising the encapsulant will melt and flow over and fill the voids of the photovoltaic cell assembly in a uniform manner. The thickness of the encapsulant layer, unless otherwise specified in limited circumstances, is the thickness of the encapsulant layer prior to lamination. In general, however, the encapsulant layer in the final photovoltaic module remains at an average total thickness of about 1 to about 120 mils (about 0.025 to about 3 mm), preferably about 2 to about 40 mils (about 0.05 to about 1 mm).

The photovoltaic cell may further comprise other functional film, sheet layers, encapsulant layers (e.g., dielectric layers or barrier layers) embedded within the module. Such functional layers may comprise any of the above mentioned polymeric films or those that are coated with additional functional coatings. For example, poly(ethylene terephthalate) (PET) films coated with a metal oxide coating, such as those described in U.S. Pat. Nos. 6,521,825 and 6,818,819 and European Patent No. 1182710, may function as oxygen and moisture barrier layers in the laminates. Additional encapsulant layers comprise other polymeric materials, such as acid copolymers, ionomers, ethylene/vinyl acetate copolymers, polyvinyl acetals (including acoustic grade polyvinyl acetals), polyurethanes, polyvinyl chlorides, polyethylenes (e.g., linear low density polyethylenes), polyolefin block copolymer elastomers, copolymers of alpha-olefins and alpha,.beta-ethylenically unsaturated carboxylic acid esters) (e.g., ethylene methyl acrylate copolymers and ethylene butyl acrylate copolymers), silicone elastomers, epoxy resins, and combinations of two or more thereof. Suitable films for the incident layer or the backing layer comprise polymers that include but are not limited to, polyesters (e.g., poly(ethylene terephthalate) and poly(ethylene naphthalate)), polycarbonate, polyolefins (e.g., polypropylene, polyethylene, and cyclic polyolefins), norbornene polymers, polystyrene (e.g., syndiotactic polystyrene), styrene-acrylate copolymers, acrylonithle-styrene copolymers, polysulfones (e.g., polyethersulfone, polysulfone, etc.), nylons, poly(urethanes), acrylics, cellulose acetates (e.g., cellulose acetate, cellulose triacetates, etc.), cellophane, silicones, polyvinyl chlorides) (e.g., polyvinyl idene chloride)), fluoropolymers (e.g., polyvinyl fluoride, polyvinylidene fluoride, polytetrafluoroethylene, and ethylene-tetrafluoroethylene copolymers), and combinations of two or more thereof. The polymeric film may be non-oriented, or uniaxially oriented, or biaxially oriented. Specific examples of films that may be used in the photovoltaic cell module outer layers (e.g., the incident layer or the backing layer) include, but are not limited to, polyester films (e.g., poly(ethylene terephthalate) films),fluoropolymer films (e.g., Tedlar®), Tefzel®), and Teflon®) films available from DuPont). Metal films, such as aluminum foil, may also be used as the backing layers. Further the films used in the solar cell module outer layers may be in the form of multi-layer films, such as a fluoropolymer/polyester/fluoropolymer multilayer film (e.g., Tedlar®)/PET/Tedlar®) or TPT laminate film available from Isovolta AG of Austria or from Madico of Woburn, Mass.).

In one process, the component layers of the photovoltaic module are stacked in the desired order to form a pre-lamination assembly. The assembly is then placed into a bag capable of sustaining a vacuum ("a vacuum bag"), the air is drawn out of the bag by a vacuum line or other means, the bag is sealed while the vacuum is maintained (e.g., at least about 27-28 in. Hg (689-711 mm Hg)), and the sealed bag is placed in an autoclave and the pressure is raised to about 150 to about 250 psi (about 11.3 to about 18.8 bar), and a temperature of about 135° C. to about 180° C., for about 10 to about 50 min. A vacuum ring may be substituted for the vacuum bag. One type of suitable vacuum bag is described in U.S. Pat. No. 3,311,517. Following the heat and pressure cycle, the air in the autoclave is cooled without adding additional air to maintain pressure in the autoclave. After about 20 min of cooling, the excess air pressure is vented and the laminates are removed from the autoclave. Alternatively, the pre-lamination assembly may be heated in an oven at about 80° C. to about 120° C. for about 20 to about 40 min, and thereafter, the heated assembly may be passed through a set of nip rolls so that the air in the void spaces between the individual layers is squeezed out, and the edge of the assembly sealed. The assembly at this stage is referred to as a pre-press. The pre-press may then be placed in an air autoclave where the temperature is raised to about 135° C. to about 180° C. at a pressure of about 100 to about 300 psi (about 6.9 to about 20.7 bar). These conditions are maintained for about 15 to about 60 min, after which the air is cooled while no further air is introduced to the autoclave. After about 20 to about 40 min of cooling, the excess air pressure is vented and the laminated products are removed from the autoclave. The photovoltaic cell modules may also be produced through non-autoclave processes. Such non-autoclave processes are described, e.g., in U.S. Pat. Nos. 3,234,062; 3,852,136; 4,341,576; 4,385,951; 4,398,979; 5,536,347; 5,853,516; 6,342,116; and 5,415,909; in U. S. Patent Publication No. 2004/0182493; in European Patent No. 1235683 B1; and in PCT Patent Publication Nos. WO91/01880 and WO03/057478. Generally, the non-autoclave processes include heating the pre-lamination assembly and the application of vacuum, pressure or both. For example, the assembly may be successively passed through heating ovens and nip rolls. (Do we need this paragraph)

In one embodiment, the curable encapsulant film is suitable as an encapsulant for optoelectronic, OLED, photovoltaic cells, organic photovoltaic cells, flexible thin film organic photovoltaic cells, CIGS photovoltaic cells, and the like. In one preferred embodiment, the encapsulant is suitable as an encapsulant for organic photovoltaics (OPV), where the moisture and oxygen barrier requirements are most demanding. The curable encapsulant film has a number of advantages over conventional liquid encapsulants. The curable encapsulant film described herein allows the material to fully flow around and over the irregular surfaces of the photovoltaic cell assembly during laminating process and therefore minimize air bubbles, and cell breakage. Further, the incorporation of the PIB and fully compatible reactive (meth)acrylic functionalized PIB or polyolefin oligomer/polymer delivery high moisture and oxygen barrier properties and the optical clarity of the encapsulant layer.

In one embodiment, an organic photovoltaic cell with an encapsulant layer containing no volatile low molecular weight (having a Mw less than about 1,000 Da) organic molecule has a higher module efficiency than cells with encapsulant layer containing volatile low molecular weight molecules. Without wishing to be bound by theory, it is believe that presence of such molecules in the encapsulant layers may create voids upon heating, affect the adhesion between the encapsulant layer and the active organic layer, and more importantly change the morphology of active organic layers because of the migration and solvation of low organic molecules in the active organic layer. As it is known from "Organic Photovoltaics: Challenges and Opportunities," by Russell Gaudiana, J. of Polymer Science: Part B: Polymer Physics 2012, DOI: 10.1002/polb.23083), the morphology of active layer is crucial to the module efficiency. For example, a high percentage of process time is focused on controlling the rate of evaporation of the solvent from active organic components because it is the major factor in establishing the optimum morphology of the active layer. The coating quality of the active layer is determined by the precise thickness, surface roughness, and pinhole-free film as possible.

In another embodiment, the encapsulant layer has a modulus of less than about $50 \times 10^4$ Pa (Pascals). In one embodiment, the modulus of the encapsulant layer ranges from about $1 \times 10^4$ Pa to about $5 \times 10^4$ Pa, and preferably from about $1 \times 10^4$ Pa to about $3 \times 10^4$ Pa. As electronic devices demand higher flexibility, lower modulus of the components including encapsulant layer is desirable.

The following examples are provided to describe the invention in further detail. These examples, which set forth a preferred mode presently contemplated for carrying out the invention, are intended to illustrate and not to limit the invention.

EXAMPLES

Components to the Samples are as follows.

Oppanol PIB series and Glassipol series, both from BASF, are PIBs.

PIB diacrylate is a PIB, having a Mw of about 14,000, with a two terminal acrylates. This was synthesized according to the method described in T. P. Liao and J. P. Kennedy, Polymer Bulletin, Vol. 6, pp. 135-141 (1981).

CN308, from Sartomer, is a reactive polybutadiene diacrylate.

RT2814 and RT2315 from Rextac LLC, are amorphous poly-alpha-olefin having a Brookfield viscosity of less than 8,000 cps at 190° C.

Linxar series from Exxon Mobil is a semicrystalline C2-C6 polyolefins with $M_w$ less than about 100,000 Da, polydispersity index less than about 3, and a melting point less than about 100° C.

Irgacure series and Lucirin TPO-L, from BASF, are photoinitiators.

Luperox series from Arkema are thermal initiators.

Trigonox 101 from Akzo Nobel is a thermal initiator.

Escorez 5380 from Exxon Mobil is a tackifier.

SR833S, from Sartomer, is a difunctional acrylate monomer and has a molecular weight of 304 Da.

Viscosity, water vapor transmission rate (WVTR), water take-up, percent transmittance (% T) refractive index, shear strength, void formation and modulus of the samples were measured as follows.

Viscosities of some uncured encapsulants were measured using a Brookfield viscometer, spindle 27, at 80° C., 120° C. or 130° C. Viscosities of some Examples were also measured with Rheometer by temperature sweep at a frequency of 10 rad/s.

Viscosities of some uncured encapsulants were measured by using ARES-M Rheometer.

WVTR, water uptake, optical transmittance and refractive index values were measured on 18 mil thick cured encapsulant film. The encapsulant were coated at 130° C., unless otherwise specified, as hot melt, using a lab scale hot melt coater, Hot Melt Coater HLC-101 from ChemInstruments, onto a 2-mil silicone release PET (polyethylene terephthalate) liner. The encapsulant film was cured by irradiating with D-bulb (Fusion Systems) with a dosage of UVA&B 500-5000 mJ/cm², depending on the sample, or by heating the encapsulant films in an oven at 150-170° C., depending on the sample. The liner was removed and the tests were performed on the 18 mil thick cured encapsulant films.

WVTR was measured with Mocon Permeatran 3/33 at 38° C./100% RH according to ASTM F-1249.

Water uptake was measured with Dynamic Vapour Sorption DVS-2000, by Surface Measurement Systems, Ltd.

Optical transmittance (% T) was measured with Perkin Elmer UV/Vis pectrometer.

Refractive Index values were measured with ABBE Refractomer by ATAGO.

Shear strength of the cured encapsulant films were measured according to Procedure A, PSTC-107, adapted as follows: (1) the encapsulant was coated at 5-6 mil thickness as described above on a 2 mil PET barrier film, laminated with 2 mil PET release liner, cured as described above, and then conditioned at 23° C. and 50% relative humidity, (2) the shear adhesion was measured under a shear load of 500 g on a 12×25 mm area, applied after wetting out the stainless test panel for 15 min. The shear strength testing was performed at 23° C. and 50% relative humidity.

For lamination void test, the encapsulants were coated on the 2-mil silicone release PET liner as above at a thickness of about 5-6 mil. The encapsulant film was transferred from the liner and laminated in between two PET barrier films at 120° C. using XRL 180 Hot Roll Laminator from Western Magnum to simulate adhesion onto a device comprising a cover and a substrate. The encapsulant film was cured as noted above. After cooling, void (air bubbles) formations were visually examined through the PET barrier films.

Example 1

The components of Samples 1-6 are listed in Table 1. All samples were prepared by mixing the components at 130° C. in a Brabender, or with a Glas-Col, as known to those of skill in the art. For samples 2 and 5, the samples were cooled to 80° C. and the thermal initiators were then added. The Brookfield viscosity profile of Sample 4 is shown in FIG. 1.

TABLE 1

| Components | \multicolumn{6}{c}{Sample (wt %)} | | | | | |
|---|---|---|---|---|---|---|
|  | 1 | 2 | 3 | 4 | 5 | 6 |
| Oppanol B15 ($M_w$ 75,000) |  |  | 77.0 |  |  |  |
| Oppanol B14 ($M_w$ 65,000) |  |  |  | 77.0 | 77.0 |  |
| Oppanol B13 ($M_w$ 60,000) | 70.0 |  |  |  |  |  |
| RT2814 |  | 75.0 |  |  |  | 75.5 |
| PIB diacrylate ($M_w$ 14,000) | 30.0 |  |  |  |  |  |
| CN308 ($M_w$ 5,000) |  | 24.5 | 22.5 | 22.5 | 22.5 | 24.5 |
| Irgacure 819 |  |  | 0.5 |  |  | 0.5 |
| Irgacure 2022 |  |  |  | 0.5 |  |  |
| Lucirin TPO-L | 1 |  |  |  |  |  |
| Luperox 231 |  | 0.5 |  |  |  |  |
| Trigonox 101 |  |  |  |  | 0.5 |  |
| Brookfield viscosity, 130° C. (cps) | 196,000 | 2,700 | 450,500 | 245,000 | 245,000 | 2,600 |
| UV dosage, mJ/cm$^2$, 5-6 mil | 1000 |  | 500 | 1000 |  | 500 |
| Thermal cure, minutes, 150-170° C. |  | 10 |  |  | 20 |  |
| WVTR at 38° C./100% RH (g/m$^2$ · day) | 0.77 | 4.87 | 1.12 | 1.30 | 1.42 | 4.53 |
| Water take-up, 23° C., 50% RH (PPM) | <100 | <100 | <100 | <100 | <100 | <100 |
| % T, 400-110 nm | >91% | >87% | >91% | >91% | >91% | >87% |
| Refractive index $n_D$, 25° C. | 1.525 | 1.509 | 1.528 | 1.528 | 1.528 | 1.509 |
| Shear strength, hr, 2.2 psi, SS | 78 | 16 | 135 | 21 | 27 | 17 |
| Lamination voids | none | none | none | none | none | none |

The encapsulants of Samples 1-6 were then coated as a film and cured, as set forth above. WVTR was measured at 38° C./100% RH on 18 mil thickness of pure encapsulant films. Water take-up, % T, refractive index and shear strength was measured on 18 mil cured encapsulant films.

The lamination test indicated no visible voids for the above samples.

Example 2

The components and properties of Sample 4 and Comparative Samples C-1 to C-4 are listed in Table 2. The Comparative Samples C-1 to C-4 were prepared similarly to the samples in Example 1.

The addition of low molecular weight SR833S did not negatively affect the shear strengths or cause voids during lamination at 120° C., however, the use of encapsulant film formed with low molecular weight monomers can significantly decrease the performance of the organic electronic device, often leading to less efficiency.

Example 3

Tackifier was added to comparative formulations C-5 to C-8, listed in Table 3. Comparative Samples C-5 to C-8 were prepared similarly to Example 1 samples.

TABLE 2

| Components | \multicolumn{5}{c}{Samples (wt %)} | | | | |
|---|---|---|---|---|---|
|  | 4 | C-1 | C-2 | C-3 | C-4 |
| Oppanol B13 ($M_w$ 60,000) |  | 80.0 | 77.0 | 89.5 |  |
| Oppanol B14 ($M_w$ 65,000) | 77.0 |  |  |  |  |
| RT2814 |  |  |  |  | 90.0 |
| CN308 ($M_w$ 5,000) | 22.5 | 14.5 | 17.5 |  |  |
| SR833S (MW 304) |  | 5.0 | 5.0 | 10.0 | 9.5 |
| Lucirin TPO-L |  |  |  | 0.5 | 0.5 |
| Irgacure 819 |  | 0.5 | 0.5 |  |  |
| Irgacure 2022 | 0.5 |  |  |  |  |
| Viscosity* 120° C. (cps) | 249,000 | 189,000 | 118,000 | 119,000 | 9,300 |
| Shear strength Before cure (2.2 psi) | 2 min | 7 min | 4 min | 2 min | 2 hr |
| Shear strength After UV cured (2.2 psi) | 4.0 hr | 8.1 hr | 6.5 hr | 13.1 hr | 13.1 hr |
| Lamination voids | none | none | none | none | none |

*Viscosity data were from Rheometer.

TABLE 3

| Components | wt % | | | | |
|---|---|---|---|---|---|
| | C-5 | C-6 | C-7 | C-8 | C-9 |
| Oppanol B50 ($M_w$ 400,000) | 5.0% | | | 3.5% | |
| Oppanol B10 ($M_w$ 36,000) | 31.9% | | | 34.1% | 31.4% |
| Linxar ($M_w$ 90,000, PDI 2.4) | | | 51.0% | | |
| RT 2814 | | 50.0% | | | |
| Escorez 5380 | 47.8% | 39.8% | 39.3% | 51.1% | 58.3% |
| SR833S (MW304) | 10.4% | 10.0% | 9.6% | 11.1% | 10.1% |
| PIB-diacrylate ($M_w$ 14,000) | 4.8% | | | | |
| Irgacure 2002 | 0.2% | 0.2% | 0.2% | 0.2% | 0.2% |
| Viscosity* at 120° C. (cps) | 7,000 | 2,600 | 5,400 | 11,000 | 4,900 |

*Viscosity data were from Rheometer.

The viscosities of the comparative samples decreased with the addition of tackifiers, however the addition of low molecular weight monomers can decrease the performance of the organic electronic device.

Example 4

The components to Samples 7-12 are listed in Table 4. The Samples were prepared similarly to Example 1.

TABLE 4

| Components | wt % | | | | |
|---|---|---|---|---|---|
| | 7 | 8 | 9 | 10 | 11 |
| Oppanol B15 ($M_w$ 75,000) | 77.4 | | | 34.0 | 45.0 |
| Oppanol B12 ($M_w$ 51,000) | | | 77.4 | | |
| RT2814, wt % | | 59.7 | | | |
| RT2315, wt % | | 19.9 | | | |
| Glassipol 2300 (MW 2,300) | | | | 54.0 | 43.0 |
| CN308 ($M_w$ 5,000) | 22.2 | 19.9 | 22.2 | 11.5 | 11.5 |
| Luperox TBEC | 0.4 | 0.5 | | | |
| Luperox 231 | | | | 0.5 | |
| Luperox 101 | | | 0.4 | | |
| Irgacure 819 | | | | | 0.5 |
| Viscosity*, 80° C. (cps) | 168,000 | 20,500 | 273,000 | 93,000 | 250,000 |
| Modulus G', 30° C. (dyn/cm²) | $8.1 \times 10^4$ | $17.0 \times 10^4$ | $10.9 \times 10^4$ | $3.6 \times 10^4$ | $8.2 \times 10^4$ |

*Viscosity data were from Rheometer.

Samples 7-11 have acceptably low viscosity at 80° C., and thus can be coated or extruded as hot melt and without any solvent even at temperatures of less than 100° C.

In addition to the coat-able viscosity at low temperatures, the low modulus values of Samples 7, 10 and 11 (modulus values less than about $10 \times 10^4$ dyn/cm²) indicate that these materials are also flexible and soft gel-like, which is desirable for some electronic displays.

Many modifications and variations of this invention can be made without departing from its spirit and scope, as will be apparent to those skilled in the art. The specific embodiments described herein are offered by way of example only, and the invention is to be limited only by the terms of the appended claims, along with the full scope of equivalents to which such claims are entitled.

We claim:

1. A curable encapsulant comprising:
    a) from about 70 to about 90 wt %, based on the total weight of the curable encapsulant, of a polyisobutylene having a Mw of from about 1,000 to about 95,000 Da;
    b) from about 10 to about 50 wt %, based on the total weight of the curable encapsulant, of a functionalized polyisobutylene having (i) a Mw of from about 1,000 to about 95,000 Da and (ii) greater than one free-radical reactive functional group per polymer chain, wherein the free-radical reactive functional group is selected from the group consisting of terminal (meth)acrylates and/or, terminal acrylates;
    c) a free radical initiator; and
    d) a UV absorber;
    wherein the curable encapsulant is (i) essentially free of an acrylic monomer with Mw less than about 1,000 Da or volatile organic compound with Mw less than about 1,000 Da, (ii) essentially free of a tackifier, and (iii) a hot melt.

2. The curable encapsulant of claim 1, wherein the UV absorber is a selected from the group consisting of benzotriazole derivatives, hydroxybenzophenones, hydroxyphenyl triazines, esters of substituted and unsubstituted benzoic acids, hindered amine light stabilizer, and mixtures thereof.

3. The curable encapsulant of claim 2, wherein the hindered amine light stabilizer is a secondary, tertiary, acetylated, N-hydrocarbyloxy substituted, hydroxyl-substituted N-hydrocarbyloxy substituted, or a substituted cyclic amine characterized by aliphatic substitution on the carbon atoms adjacent to the amine function.

4. The curable encapsulant of claim 1 further comprising a functionalized polyolefin, wherein the functionalized polyolefin has (i) a Mw of from about 1,000 to about 95,000 Da and (ii) greater than 1 free-radical reactive functional group;
    wherein the free-radical functional group is selected from the group consisting of terminal (meth)acrylates and/or terminal acrylates.

5. The curable encapsulant of claim 1 further comprising up to 20 wt % of a plurality of desiccant fillers.

6. The curable encapsulant of claim 1 which comprises less than 5,000 ppm of a volatile organic molecule having a Mw less than 1,000 Da.

7. A curable encapsulant comprising:
a) from about 70 to about 90 wt %, based on the total weight of the curable encapsulant, a polyisobutylene having a Mw of from about 1,000 to about 95,000 Da;
b) from about 10 to about 50 wt %, based on the total weight of the curable encapsulant, a functionalized polyolefin having (i) a Mw of from about 1,000 to about 95,000 Da and (ii) greater than one free-radical reactive functional group per polymer chain, wherein the free-radical reactive functional group is selected from the group consisting of terminal (meth)acrylates and/or, terminal acrylates;
c) a free radical initiator; and
d) a UV absorber wherein the curable encapsulant is (i) essentially free of an acrylic monomer with Mw less than about 1,000 Da or volatile organic compound with Mw less than about 1,000 Da, (ii) essentially free of a tackifier, and (iii) a hot melt.

8. The curable encapsulant of claim 7, wherein the UV absorber is a selected from the group consisting of benzotriazole derivatives, hydroxybenzophenones, hydroxyphenyl triazines, esters of substituted and unsubstituted benzoic acids, hindered amine light stabilizer, and mixtures thereof.

9. The curable encapsulant of claim 7, wherein the hindered amine light stabilizer is a secondary, tertiary, acetylated, N-hydrocarbyloxy substituted, hydroxyl-substituted N-hydrocarbyloxy substituted, or a substituted cyclic amine characterized by aliphatic substitution on the carbon atoms adjacent to the amine function.

10. The curable encapsulant of claim 7 wherein the functionalized polyolefin is selected from the group consisting of (meth)acrylate-terminated polybutadiene, hydrogenated (meth)acrylate-terminated polybutadiene, and mixtures thereof.

11. The curable encapsulant of claim 7 further comprising up to 20 wt % of a plurality of desiccant fillers.

12. The curable encapsulant of claim 7 which comprises less than 5,000 ppm of a volatile organic molecule having a Mw less than 1,000 Da.

13. A curable encapsulant comprising:
a) from about 70 to about 90 wt %, based on the total weight of the curable encapsulant, an amorphous polyalphaolefin having a Brookfield viscosity less than 8,000 cps at 190° C.;
b) from about 10 to about 50 wt %, based on the total weight of the curable encapsulant, a functionalized polyisobutylene or functionalized polyolefin having (i) a Mw of from about 1,000 to about 95,000 Da and (ii) greater than one free-radical reactive functional group per polymer chain, wherein the free-radical reactive functional group is selected from the group consisting of terminal (meth)acrylates and/or, terminal acrylates;
c) a free radical initiator;
d) a tackifier; and
e) a UV absorber;
wherein the functionalized polyolefin is selected from the group consisting of (meth)acrylate-terminated polybutadiene, hydrogenated (meth)acrylate-terminated polybutadiene, and mixtures thereof
wherein the curable encapsulant is (i) essentially free of an acrylic monomer with Mw less than about 1,000 Da or volatile organic compound with Mw less than about 1,000 Da and (ii) a hot melt.

14. The curable encapsulant of claim 13, wherein the UV absorber is a selected from the group consisting of benzotriazole derivatives, hydroxybenzophenones, hydroxyphenyl triazines, esters of substituted and unsubstituted benzoic acids, hindered amine light stabilizer, and mixtures thereof.

15. The curable encapsulant of claim 13, wherein the hindered amine light stabilizer is a secondary, tertiary, acetylated, N-hydrocarbyloxy substituted, hydroxyl-substituted N-hydrocarbyloxy substituted, or a substituted cyclic amine characterized by aliphatic substitution on the carbon atoms adjacent to the amine function.

16. The curable encapsulant of claim 13 further comprising up to 20 wt % of a plurality of desiccant fillers.

17. An article comprising the curable encapsulant of claim 1 which is an electronic device.

18. An article comprising the curable encapsulant of claim 7 which is an electronic device.

19. An article comprising the curable encapsulant of claim 13 which is an electronic device.

* * * * *